United States Patent [19]
Etoh et al.

[11] Patent Number: 5,698,999
[45] Date of Patent: Dec. 16, 1997

[54] SAMPLING AND HOLDING DEVICE

[75] Inventors: Toshiyuki Etoh; Susumu Yasuda, both of Tokyo, Japan

[73] Assignee: NEC Corporation, Japan

[21] Appl. No.: 620,790

[22] Filed: Mar. 28, 1996

[30] Foreign Application Priority Data

Mar. 31, 1995 [JP] Japan .................................. 7-075721

[51] Int. Cl.$^6$ ............................................... G11C 27/02
[52] U.S. Cl. ................................................. 327/94
[58] Field of Search ................... 327/52, 56, 65, 327/67, 69, 89, 90, 91, 93–96, 337, 554, 561, 563

[56] References Cited

U.S. PATENT DOCUMENTS

| | | | |
|---|---|---|---|
| 4,353,044 | 10/1982 | Nossek | 327/554 |
| 4,988,900 | 1/1991 | Fensch | 327/554 |
| 5,144,160 | 9/1992 | Lee et al. | 327/96 |
| 5,359,294 | 10/1994 | Ganger et al. | 327/94 |
| 5,381,053 | 1/1995 | Yasuda | 327/91 |
| 5,391,999 | 2/1995 | Early et al. | 327/554 |
| 5,523,719 | 6/1996 | Longo et al. | 327/554 |
| 5,565,812 | 10/1996 | Soenen | 327/554 |

FOREIGN PATENT DOCUMENTS 207794  3/1984  Germany .................................. 327/94

*Primary Examiner*—Timothy P. Callahan
*Assistant Examiner*—My-Trang Nu Ton
*Attorney, Agent, or Firm*—Hayes, Soloway, Hennessey, Grossman & Hage, P.C.

[57] ABSTRACT

There is provided signal node for receiving a signal, a reference node having a reference voltage, an operational amplifier having an input terminal and an output terminal, a first capacitor, and a second capacitor equivalent in capacitance to the first capacitor connectable by a combination of switches responsive to a control signal for connecting the first capacitor between the signal node and the reference node and the second capacitor between the input terminal and the output terminal of the operational amplifier, and to an inverted signal of the control signal for connecting the second capacitor between the signal node and the reference node and the first capacitor between the input terminal and the output terminal of the operational amplifier, the control signal and the inverted signal thereof being complementary to each other so as to be alternately effective.

5 Claims, 7 Drawing Sheets

F I G. 7
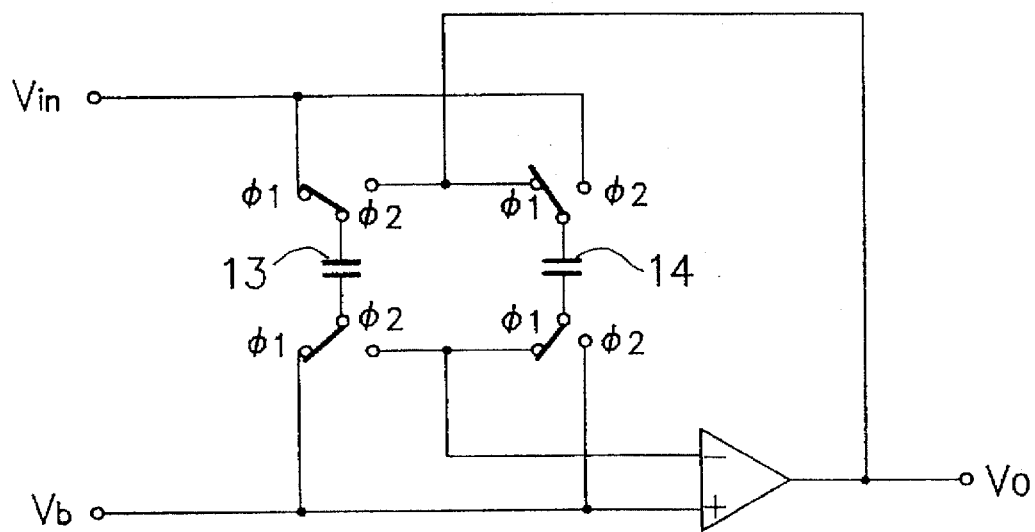

SAMPLING AND HOLDING DEVICE

BACKGROUND OF THE INVENTION

1. Field of the Invention

The present invention generally relates to a sampling and holding (hereafter sometimes "SH") device, and particularly, to a pipelinable SH device in which a pair of capacitors are adapted for SH actions.

2. Description of the Related Art

There has been employed a dual-ciruit type pipelinable SH device in which a pair of SH circuits are adapted for alternatively performing a sampling action and a holding action, to provide higher operation speed than an SH unit composed of a capacitor and a single operational amplifier of which an output inherently contains an offset component relative to an input.

FIG. 1 is one circuit diagram of a conventional SH device.

The conventional SH device comprises a pair of offset cancelling SH circuits 40 and 41, input switch 31 responsive to a pair of control signals $\phi1$ and $\phi2$ for switching to connect a pair of differential voltage signal input terminals $Vin^+$ and $Vin^-$ alternatively to the SH circuits 40 and 41, and output switch 32 responsive to the control signals $\phi2$ and $\phi1$ for switching to alternatively connect the SH circuits 40 and 41 to a pair of differential voltage signal output terminals $Vout^-$ and $Vout^+$.

One SH circuit 40 comprises differentially acting operational amplifier 21, a pair of equi-capacitance capacitors 1 and 2 and a pair of feedback circuits 21a and 21b.

Each feedback circuit 21a or 21b connects a polarity-defined output terminal (−) or (+) of the operational amplifier 21 alternatively to a primary side 1a or 2a of a corresponding one of the capacitors 1 and 2 that is connected to a corresponding input terminal 40a or 40b of the SH circuit 40, and a secondary side 1b or 2b of the corresponding capacitor that is connected to an opposite polarity input terminal (+) or (−) of the amplifier 21, respectively, depending on levels of the paired control signals $\phi1$ and $\phi2$.

The other SH circuit 40 also comprises operational amplifier 22, a pair of equi-capacitance capacitors 3 and 4 and a pair of feedback circuits 22a and 22b.

Each feedback circuit 22a or 22b connects a polarity-defined output terminal (−) or (+) of the operational amplifier 22 alternatively to a primary side 3a or 4a of a corresponding one of the capacitors 3 and 4 that is connected to a corresponding input terminal 41a or 41b of the SH circuit 41, and a secondary side 3b or 4b of the corresponding capacitor that is connected to an opposite polarity input terminal (+) or (−) of the amplifier 22, respectively, depending on levels of the paired control signals $\phi1$ and $\phi2$.

Each switch element closes or selects a closed position, when a control signal designated by an accompanying reference character becomes high.

FIG. 2 shows time charts of the control signals $\phi1$ and $\phi2$ and SH actions of the circuits 40 and 41.

The control signals $\phi1$ and $\phi2$ are inverted signals relative to each other so that when either has a high level, the other has a low level, or vice versa.

With the control signal $\phi1$ at a high level, the SH circuit 40 is put in a sampling state, in which the operational amplifier 21 has its (−) and (+) outputs fully fed back to its (+) and (−) input terminals, respectively, and the $Vin^+$ and $Vin^-$ terminals are connected via the input switch 31 to the input terminals 40a and 40b of the SH circuit 40, respectively, so that the capacitor 1 is charged to a potential difference between the $Vin^+$ terminal and the secondary side 1b of the capacitor 1 that is connected to the (+) input terminal of the amplifier 21, and the capacitor 2 is charged to a potential difference between the $Vin^-$ terminal and the secondary side 2b of the capacitor 2 that is connected to the (−) input terminal of the amplifier 21.

Accordingly, voltage developed across the capacitor 1 and that developed across the capacitor 2 cooperatively define a differential voltage therebetween representing a voltage difference between the $Vin^+$ and $Vin^-$ terminals, i.e. current input signal voltage Vi, minus a voltage difference between the (+) and (−) input terminals of the amplifier 21, i.e. an offset voltage (hereafter sometimes "Voff"), as an open gain (hereafter sometimes "$\mu$") of each amplifier is assumed to be ideal ($\mu \approx \infty$). As a result, the input signal Vi is sampled, like SAMPLE(1) of FIG. 2, with the offset voltage Voff.

Letting $Vos^-$ and $Vos^+$ be potentials at the (−) and (+) output terminals of the amplifier 21 in the sampling state, respectively, and Q1 and Q2 be quantities of charges stored in the capacitors 1 and 2, respectively, it follows that:

$Q1 = C(Vos^- - Vin^+)$, $Q2 = C(Vos^+ - Vin^-)$, and $Vos = Vos^- - Vos^+ = Voff$ ($\because Vo/\mu = 0$), where C is capacitance of the capacitors 1 to 4, and Vos is differential output in the sampling state of the amplifier 21.

On the other hand, the SH circuit 41 is put in a holding state, in which the operational amplifier 22 has its (−) and (+) outputs fed back to the primary side 3a of the capacitor 3 and the primary side 4a of the capacitor 4, respectively, so that the capacitor 3 is connected between the (−) output terminal and the (+) input terminal of the amplifier 22 and the capacitor 4 is connected between the (+) output terminal and the (−) input terminal of the amplifier 22.

To the contrary, when the control signal $\phi2$ is at a high level, the SH circuit 40 is put in a holding state HOLD(1) in which the operational amplifier 21 has its (−) and (+) outputs fed back to the primary side 1a of the capacitor 1 and the primary side 2a of the capacitor 2, respectively, so that the capacitor 1 in which a charge quantity Q1 is kept unchanged between before and after the switching is connected between the (−) output terminal and the (+) input terminal of the amplifier 21 and the capacitor 2 in which a charge quantity Q2 also is kept unchanged is connected between the (+) output terminal and the (−) input terminal of the amplifier 21.

Therefore, letting $Vih^+$ and $Vih^-$ be potentials at the (+) and (−) input terminals of the amplifier 21 in the holding state, respectively, and $Voh^-$ and $Voh^+$ be potentials at the (−) and (+) output terminals of the amplifier 21 in the holding state, respectively, it follows that:

$Q1 = C(Vos^- - Vin^+) = C(Vih^+ - Voh^-)$, $Q2 = C(Vos^+ - Vin^-) = C(Vih^- - Voh^+)$, and $Vih^+ - Vih^- = Voff \because (Voh^- - Voh^+)/\mu = 0$.

$\therefore Voh = Voh^- - Voh^+ = Vin^+ - Vin^- = Vi$, where Voh is differential output in the holding state of the amplifier 21.

Accordingly, the sampled differential voltage Vi at the SAMPLE(1) is held so as to be output as Vo (=Voh =Vi) in the HOLD(1), where the offset voltage Voff is cancelled.

Such cancelling is permitted as the SH circuit 40 is alternatively (not concurrently) operative for sampling and holding actions.

On the other hand, the SH circuit 41 is now put in a sampling state SAMPLE ② in which the capacitors 1 and 2 cooperate with each other for sampling to hold therebetween differential voltage equivalent to current input signal voltage Vi.

Similarly, SH actions (SAMPLE①, HOLD②, SAMPLE③, HOLD③, SAMPLE⑤, . . . ) of the circuit 40 and those (SAMPLE ②, HOLD②, SAMPLE④, HOLD④, . . . ) of the circuit 41 are concurrently performed in complementary manner, like "HOLD①, SAMPLE②", "SAMPLE③, HOLD②", "HOLD③, SAMPLE④" and "SAMPLE⑤, HOLD④", achieving two-fold speed in comparison with a single SH unit.

However, the conventional SH device, which includes a pair of offset cancelling SH circuits, has a complicated arrangement, as a result of which an IC including such a device tends to occupy relatively large chip area and have increased power consumption.

For the conventional SH device, offset cancel function is unavoidable, since respective SH circuits have their offset values. Unless such a function is provided, an output signal will have an offset component varying each time when SH circuits are switched over, as if noises were superimposed on the signal.

Moreover, in the conventional device, a pair of operational amplifiers have their dynamic characteristics, such as gain and frequency characteristics, which may well be mismatched, causing distortion.

The present invention has been achieved with such points in mind.

SUMMARY OF THE INVENTION

It therefore is an object of the present invention to provide an SH device of a parallel-capacitor type with low power consumption and improved cost effect, permitting competent operation speed compared to a conventional device.

To achieve this object, one aspect of the present invention provides a sampling and holding device comprising a first signal node for receiving a first signal, a reference node having a reference voltage, an operational amplifier having a first input terminal and a first output terminal, a first capacitor, a second capacitor equivalent in capacitance to the first capacitor, and switch means responsive to a first control signal for connecting the first capacitor between the first signal node and the reference node and the second capacitor between the first input terminal and the first output terminal of the operational amplifier, and to a second control signal for connecting the second capacitor between the first signal node and the reference node and the first capacitor between the first input terminal and the first output terminal of the operational amplifier, the first and second control signals being complementary to each other so as to be alternately effective.

According to this aspect of the invention, on the one hand, when the first control signal is effective, a first capacitor is connected between a signal node and a reference node so that current voltage of an input signal is sampled to be held in the first capacitor, and when the second control signal is effective, the first capacitor is connected between an input terminal and an output terminal of an operational amplifier so that the held signal in the first capacitor is output through the amplifier; and on the other hand, when the second control signal is effective, a second capacitor is connected between the signal node and the reference node so that a subsequent voltage of the input signal is sampled to be held in the second capacitor, and when the first control signal is again effective, the second capacitor is connected between the input and output terminals of the amplifier so that the held signal in the second capacitor is output through the amplifier.

Since the first and second control signals are alternately effective, a sampling action and a holding action are concurrently performed in a single SH unit, thus achieving low power consumption and improved cost effect, permitting operation speed to be comparable to a conventional device.

According to another aspect of the invention, the sampling and holding device further comprises a second signal node for receiving a second signal, the operational amplifier having a second input terminal with an opposite polarity to the first input terminal and a second output terminal with an opposite polarity to the first output terminal, a third and a fourth capacitor each equivalent in capacitance to the first capacitor, and the switch means being responsive to the first control signal for connecting the third capacitor between the second signal node and the reference node and the fourth capacitor between the second input terminal and the second output terminal of the operation amplifier, and to the second control signal for connecting the fourth capacitor between the second signal node and the reference node and the third capacitor between the second input terminal and the second output terminal of the operational amplifier.

According to this aspect of the invention, a differential input signal is sampled and held to be output as a differential output signal.

According to a preferred embodiment of this aspect of the invention, the sampling and holding device further comprises a pair of weighting nodes for receiving a weighting differential signal, a fifth, a sixth, a seventh and an eighth capacitor each equivalent in capacitance to the first capacitor, and the switch means being responsive to the first control signal for connecting the fifth capacitor between the first signal node and the reference node, the sixth capacitor between the second signal node and the reference node, the seventh capacitor between the first input terminal of the operation amplifier and one of the weighting nodes, and the eighth capacitor between the second input terminal of the operation amplifier and the other of the weighting nodes, and to the second control signal for connecting the seventh capacitor between the first signal node and the reference node, the eighth capacitor between the second signal node and the reference node, the fifth capacitor between the first input terminal of the operational amplifier and said one of the weighting nodes, and the sixth capacitor between the second input terminal of the operational amplifier and said other of the weighting nodes.

According to this embodiment of the invention, a sampled differential signal is held to be output, in a weighting manner.

Further, to achieve the aforesaid object, of the invention another aspect of the invention provides a sampling and holding device comprising a pair of capacitor means concurrently operable for alternatively sampling to hold a first voltage by storing therein a first quantity of charges and alternatively supplying a second voltage defined by a second quantity of charges stored therein, and an operational amplifier for amplifying the second voltage to output a third voltage representative of the first voltage.

BRIEF DESCRIPTION OF THE DRAWINGS

The objects, features and advantages of the present invention will become more apparent from consideration of the following detailed description, in conjunction with the accompanying drawings, in which:

FIG. 7 is a circuit diagram of an SH device according to another embodiment of the invention.

DESCRIPTION OF THE PREFERRED EMBODIMENTS

Figure 1:
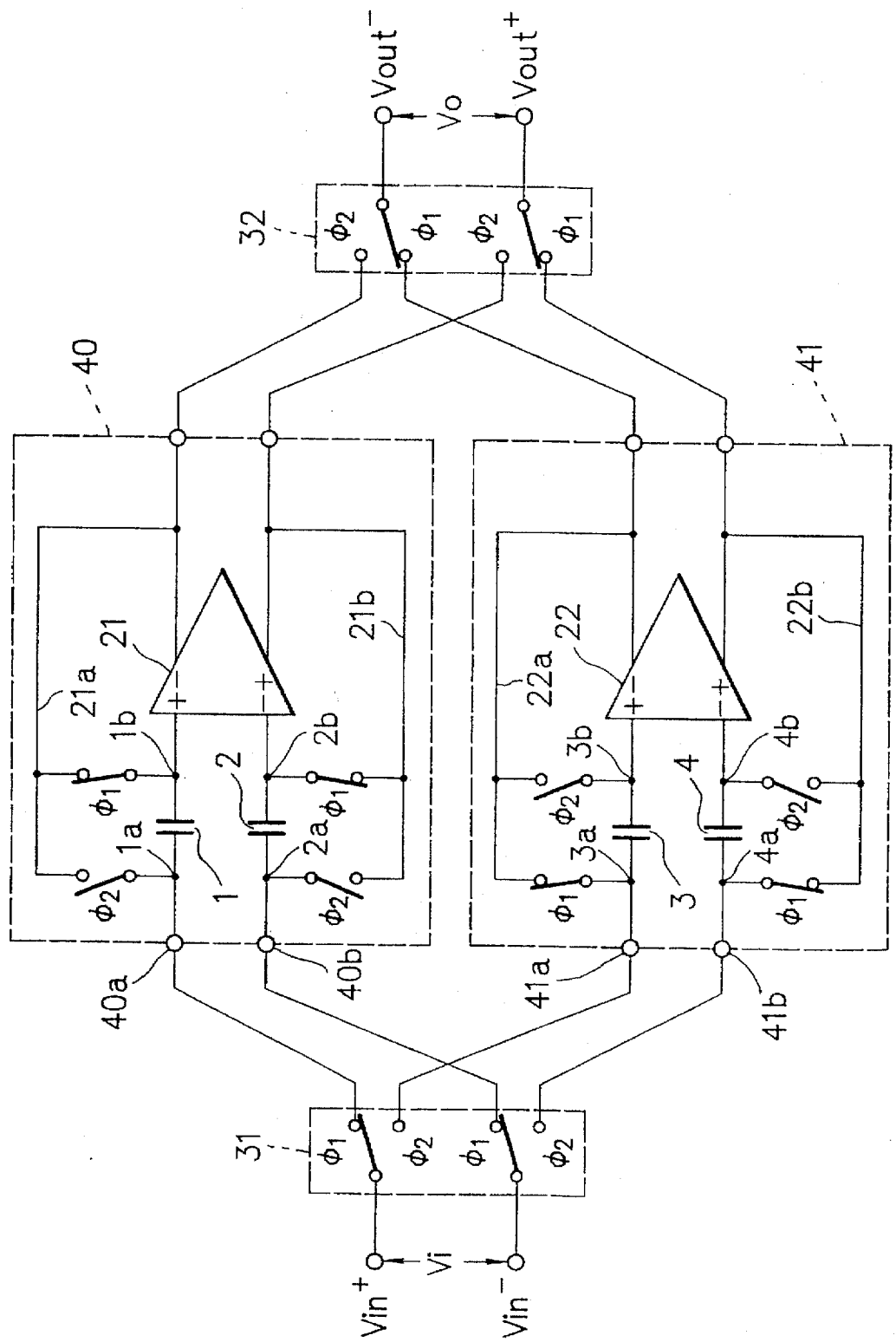
FIG. 1 is a circuit diagram of a conventional parallel-pipelined SH device.
Figure 2:
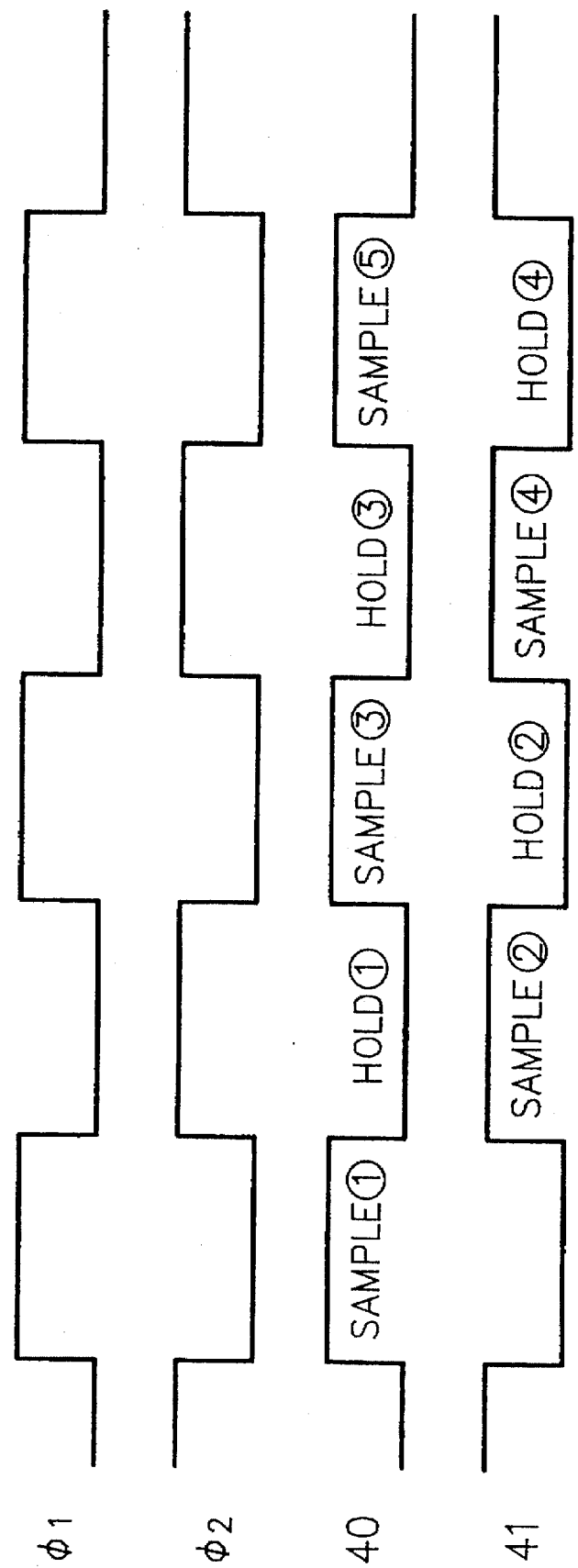
FIG. 2 shows time charts of control signals and SH actions in the device of FIG. 1.

There will be detailed below preferred embodiments of the present invention, with reference to FIGS. 3 to 6. Like members are designated by like reference characters.

Figure 3:
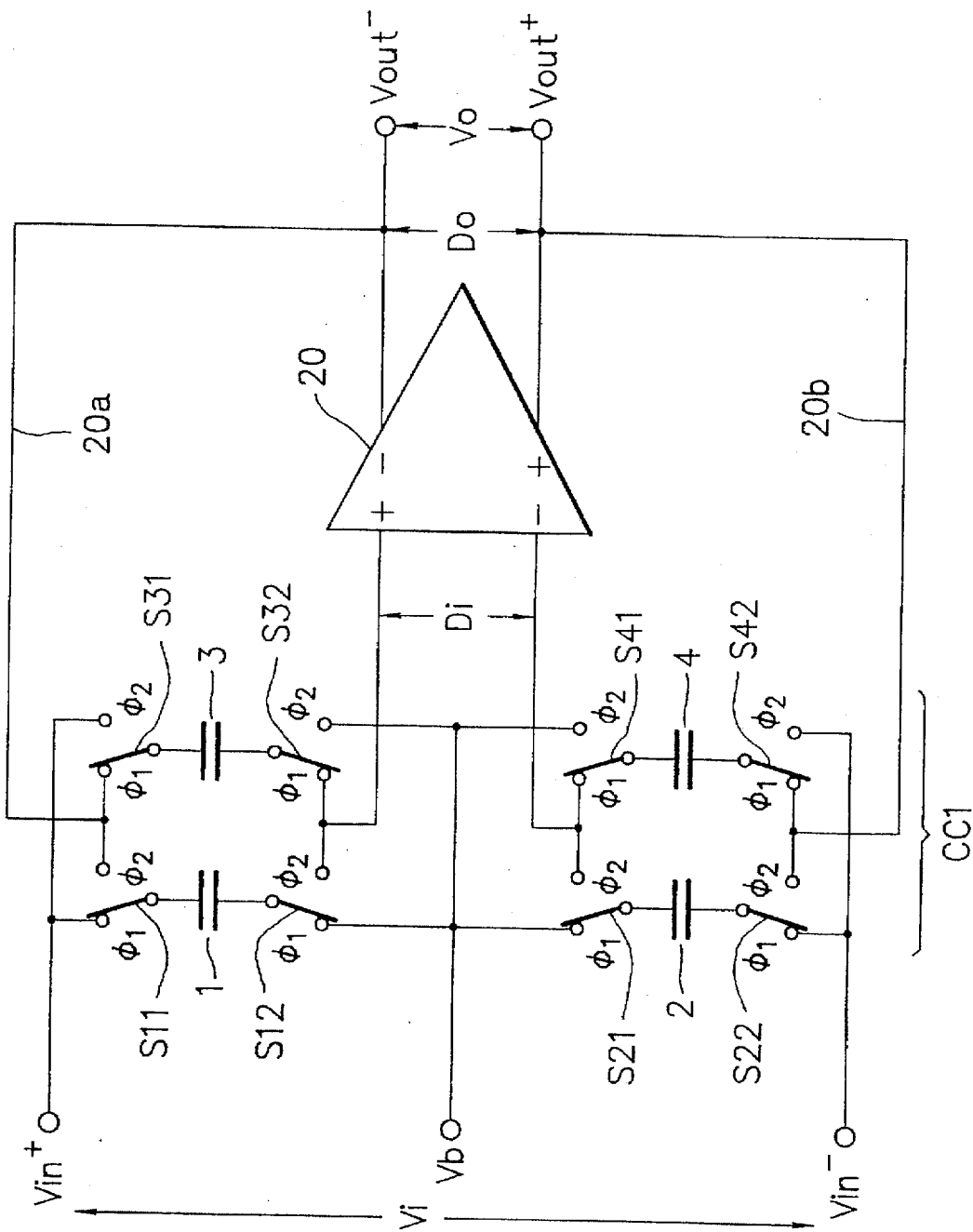
FIG. 3 is a circuit diagram of an SH device according to an embodiment of the invention.

FIG. 3 is a circuit diagram of an SH device according to an embodiment of the invention.

The SH device comprises: a pair of input terminals $Vin^+$ and $Vin^-$ for inputting a differential signal voltage Vi; capacitor circuitry CC1 for sampling to hold the input signal voltage Vi, the circuitry CC1 being composed of four of equi-capacitance capacitors 1 to 4 and a total of four pairs of switch elements S11/S12, S21/S22, S31/S32 and S41/S42 operable for connection control of the capacitors 1 to 4; an operational amplifier 20 with (+) and (−) input terminals for receiving a differential input Di from the capacitor circuitry CC1 and (−) and (+) output terminals for providing an amplified differential output Do ($\mu \approx 1,000 \sim \infty$), the (−) and (+) output terminals being connected via feedback circuits 20a and 20b to the capacitor circuitry CC1, respectively; and a pair of output terminals $Vout^-$ and $Vout^+$ connected to the (−) and (+) output terminals of the amplifier 20 to output the differential output Do, as a differential output signal voltage Vo. Designated at Vb is a reference voltage terminal.

In the capacitor circuitry CC1, the switch elements S11/S12, S21/S22, S31/S32 and S41/S42 are concurrently operated by a combination of a control signal $\phi 1$ responsible for a sampling period and a control signal $\phi 2$ as an inverted signal of the control signal $\phi 1$, such that the capacitors 1 and 2 and the capacitors 3 and 4 are alternatively paired to be serially connected for differentially sampling to hold the input signal voltage Vi, and are alternatively connected between the feedback circuits 20a and 20b and the (+) and (−) input terminals of the amplifier 20, respectively, so that the differentially sampled voltage Vi is applied as the input voltage Di to and between these (+) and (−) terminals, thus outputting the amplified voltage Do as the signal voltage Vo.

Figure 4:
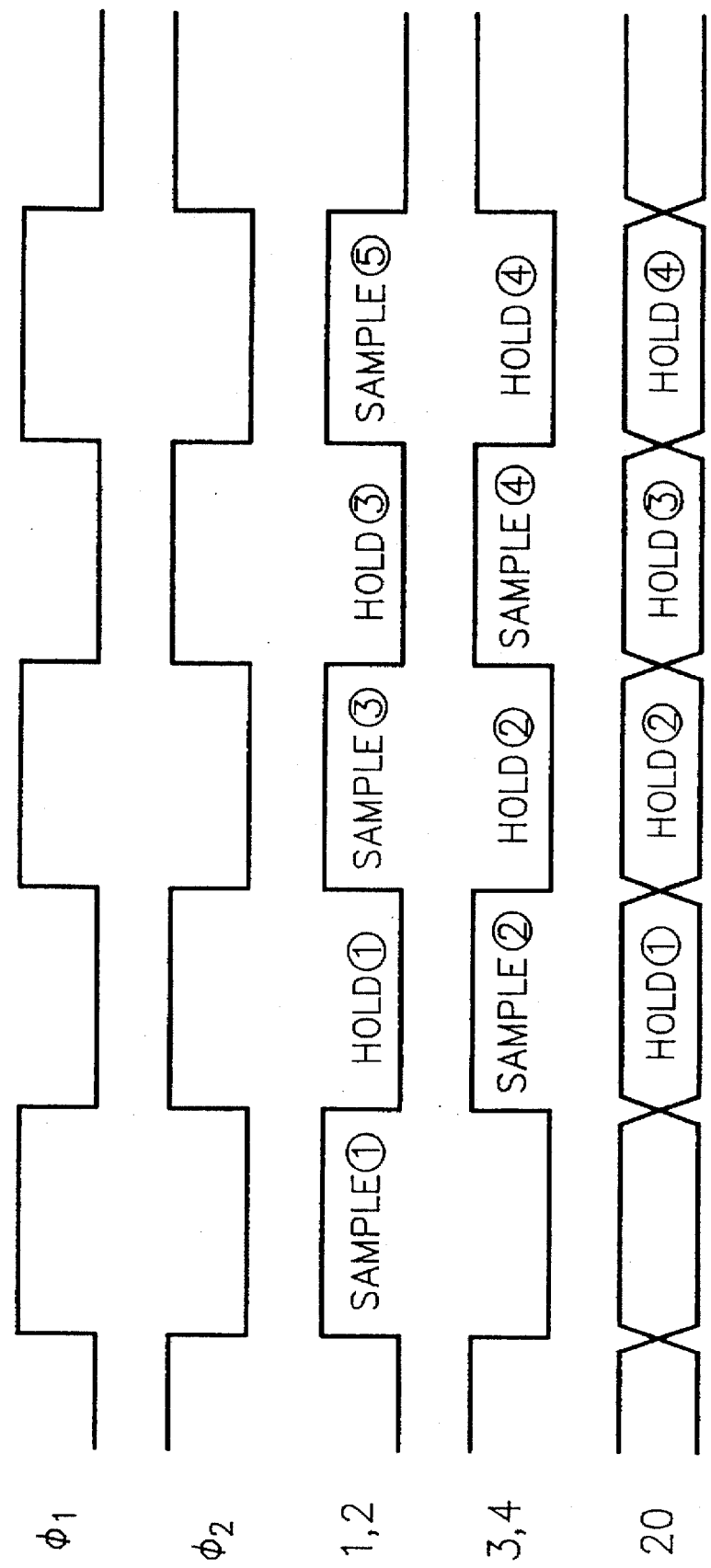
FIG. 4 shows time charts of control signals and SH actions in the device of FIG. 3.

FIG. 4 shows time charts of the control signals $\phi 1$ and $\phi 2$ and SH actions in the device of FIG. 3.

When the control signal $\phi 1$ is at a high level, the switch elements S11/S12 and S21/S22 close at their left positions in FIG. 3, connecting the capacitor 1 between the terminals $Vin^+$ and Vb and the capacitor 2 between the terminals Vb and $Vin^-$, so that a current input signal voltage Vi is sampled to be differentially held by the capacitors 1 and 2.

On the other hand, with the control signal $\phi 1$ at the high level, the switch elements S31/S32 and S41/S42 close at their left positions in FIG. 3, connecting the capacitor 3 Between the feedback circuit 20a and the (+) input terminal of the amplifier 20 and the capacitor 4 between the (−) input terminal of the amplifier 20 and the feedback circuit 20b, so that a differential voltage representable by charges having been stored until then in the capacitors 3 and 4 is still held therebetween and hence applied as the input voltage Di to the amplifier 20, thus differentially outputting the signal voltage Vo.

To the contrary, when the control signal $\phi 2$ is at a high level, the switch elements S31/S32 and S41/S42 close at their right positions in FIG. 3, connecting the capacitor 3 between the terminals $Vin^+$ and Vb and the capacitor 4 between the terminals Vb and $Vin^-$, so that a current input signal voltage Vi is sampled to be differentially held by the capacitors 3 and 4.

On the other hand, with the control signal $\phi 2$ at the high level, the switch elements S11/S12 and S21/S22 close at their right positions in FIG. 3, connecting the capacitor 1 between the feedback circuit 20a and the (+) input terminal of the amplifier 20 and the capacitor 2 between the (−) input terminal of the amplifier 20 and the feedback circuit 20b, so that the differentially sampled voltage Vi is applied as the input voltage Di to the amplifier 20, thus differentially outputting the signal voltage Vo.

Like this, SH actions of the capacitor pair 1–2 and those of the capacitor pair 3–4 are concurrently performed in a complementary manner, permitting the amplifier 20 to be always put in a holding state, achieving a two-fold speed increase in comparison with a conventional single SH unit, whose speed is comparable with the conventional case.

Moreover, the SH device of FIG. 3 simply employs a single operational amplifier operable at a speed comparable to a conventional SH circuit pair, but requires a mere half chip area for IC installation and a mere half power consumption, when compared with a conventional SH device.

Figure 5:
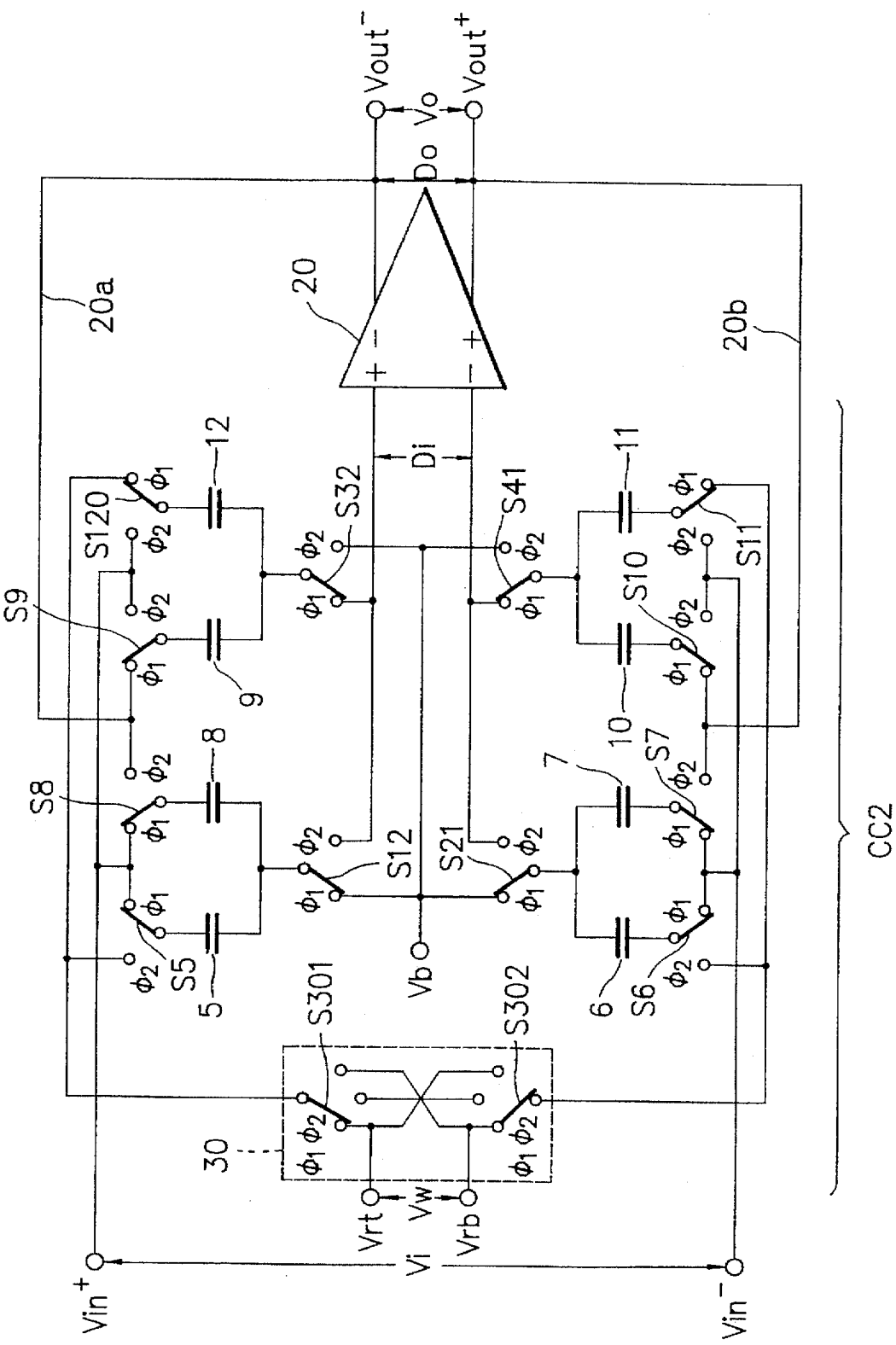
FIG. 5 is a circuit diagram of an SH device according to another embodiment of the invention.

FIG. 5 is a circuit diagram of an SH device according to another embodiment of the invention.

The SH device comprises: a pair of input terminals $Vin^+$ and $Vin^-$ for inputting a differential signal voltage Vi; capacitor circuitry CC2 for sampling to hold the input signal voltage Vi, the circuitry CC2 being composed of a total of four pairs of equi-capacitance capacitors 5/8, 6/7, 9/12 and 10/11 for differentially sampling and holding the signal voltage Vi, a total of four triple of switch elements S5–S8/S12, S21/S6–S7, S9–S120/S32 and S41/S10–S11 operable for connection control of the capacitors 5 to 12 to effect weightable SH actions, and a pair of switch elements S301/S302 for of weighting control to the holding of the sampled voltage Vi; an operational amplifier 20 with (+) and (−) input terminals for receiving a differential input Di from the capacitor circuitry CC2 and (−) and (+) output terminals for providing an amplified differential output Do, the (−) and (+) output terminals being connected via feedback circuits 20a and 20b to the capacitor circuitry CC2, respectively; and a pair of output terminals $Vout^-$ and $Vout^+$ connected to the (−) and (+) output terminals of the amplifier 20 to output the differential output Do, as a differential output signal voltage Vo.

In FIG. 5, designated at Vb is a basic reference voltage terminal, Vrt ahd Vrb are paired terminals for supplying a pair of reference voltages (i.e. a differential weighting signal: Vw=Vrt−Vrb) controlled for the weighting, and 30 is a switching circuit in which the switch element S301 as well as the switch element S302 is operated in accordance with a combination of control signals φ1 and φ2 so as to have one of three positions: a switch position for connection to the terminal Vrt, a switch position for short-circuit connection and a switch position for connection to the terminal Vrb.

In the capacitor circuitry CC2, the switch elements S5–S8/S12, S21/S6–S7, S9–S120/S32, S41/S10–S11 and S301/S302 are concurrently operated by the pair of control signals φ1 and φ2, such that the capacitor pairs 5/8 (parallel to each other) and 6/7 (parallel to each other) and the capacitor pairs 9/12 (parallel to each other) and 10/11 (parallel to each other) are alternatively paired to be serially connected for differentially sampling to hold the input signal voltage Vi, and inner ones 8, 7 of the pairs of capacitors 5/8 and 6/7 and inner ones 9, 10 of the pairs of capacitors 9/12 and 10/11 are alternatively connected between the feedback circuits 20a and 20b and the (+) and (−) input terminals of the amplifier 20, respectively, and outer ones 5, 6 of the pairs of capacitors 5/8 and 6/7 and outer ones 12, 11 of the pairs of capacitors 9/12 and 10/11 are alternatively connected between the switching circuit 30 and the (+) and (−) input terminals of the amplifier 20, respectively, so that a parallel-superimposed voltage between the differentially sampled voltage Vi and a weight-controlled voltage thereof is applied as the input voltage Di to and between the (+) and (−) terminals of the amplifier 20, thus outputting the amplified voltage Do as the signal voltage Vo.

Figure 6:
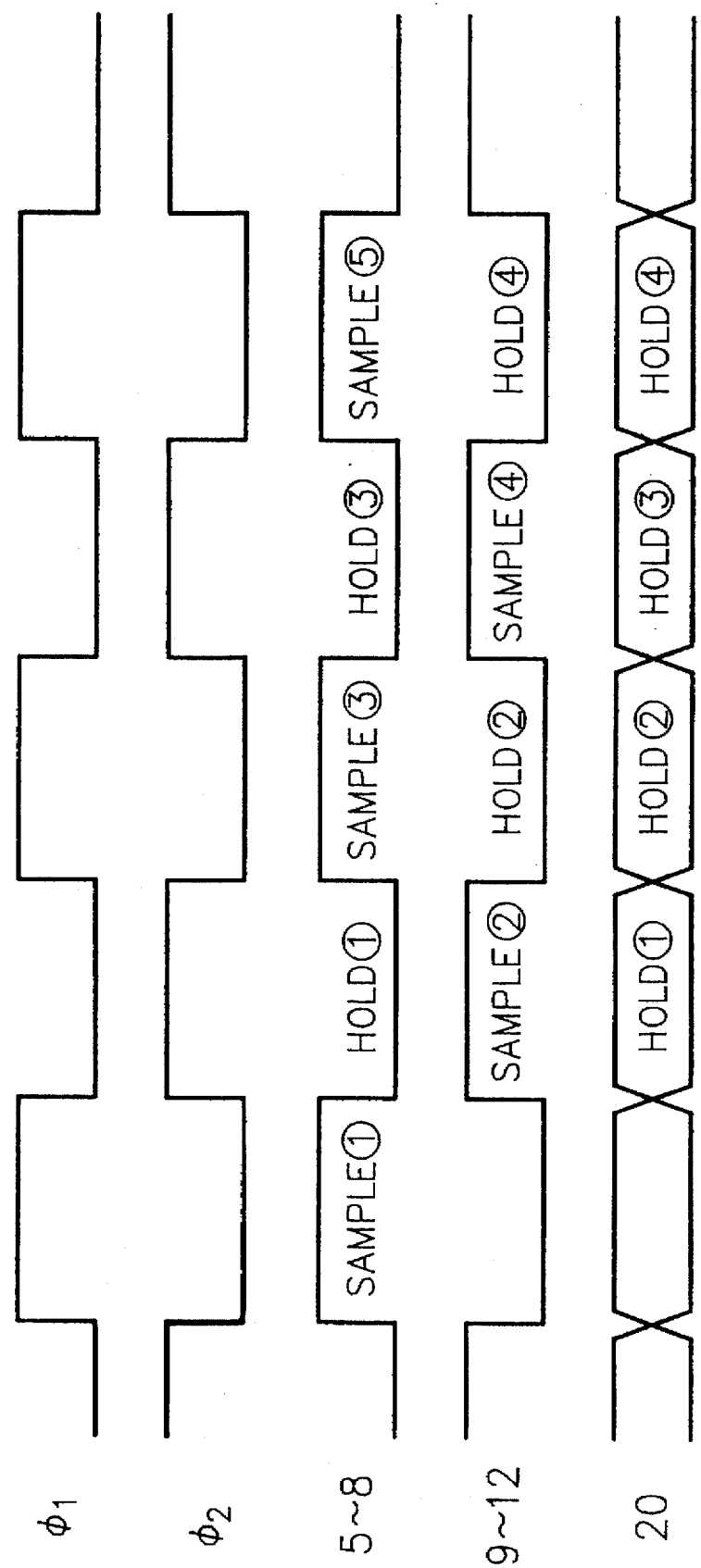
FIG. 6 shows time charts of control signals and SH actions in the device of FIG. 5.

FIG. 6 shows time charts of control signals and SH actions in the device of FIG. 5.

When the control signal φ1 is at a high level, the switch elements S5–S8/S12 and S21/S6–S7 close as shown in FIG. 5, connecting the pair of parallel capacitors 5 and 8 between the terminals Vin$^+$ and Vb and the pair of parallel capacitors 6 and 7 between the terminals Vb and Vin$^-$, so that current input signal voltage Vi is sampled to be differentially held by the capacitor pairs 5/8 and 6/7.

On the other hand, with the control signal φ1 at the high level, the switch elements S9–S120/S32 and S41/S10–S11 close as shown in FIG. 5, connecting the capacitor 9 between the feedback circuit 20a and the (+) input terminal of the amplifier 20 and the capacitor 12 between the switch element S301 of the switching circuit 30 and the (+) input terminal of the amplifier 20 and further the capacitor 10 between the (−) input terminal of the amplifier 20 and the feedback circuit 20b and the capacitor 11 between the (−) input terminal of the amplifier 20 and the switch element S302 of the switching circuit 30, so that a differential voltage representable by charges reassigned to be stored in the capacitor pairs 9/12 and 10/11 is applied as the input voltage Di to the amplifier 20, thus differentially outputting the signal voltage Vo.

Accordingly, there is held to be output the sampled signal voltage Vi, as it is level-controlled by a combination of actions of the switch elements S301 and S302 (connected to the terminals Vrt and Vrb in FIG. 5) and the weighting reference voltages, as necessary, partly because of the signal voltage Vi that is an analog signal which may be susceptive to variations such as those resulting from variations in ambient temperature and partly because of the signal voltage Vo which also is an analog signal that may need to meet a variety of requirements.

To the contrary, when the control signal φ2 is at a high level, the switch elements S9–S120/S32 and S41/S10–S11 close at their opposite positions to FIG. 5, connecting the pair of parallel capacitors 9 and 12 between the terminals Vin$^+$ and Vb and the pair of parallel capacitors 10 and 11 between the terminals Vb and Vin$^-$, so that current input signal voltage Vi is sampled to be differentially held by the capacitor pairs 9/12 and 10/11.

On the other hand, with the control signal φ2 at the high level, the switch elements S5–S8/S12 and S21/S6–S7 close at their opposite positions to FIG. 5, connecting the capacitor 8 between the feedback circuit 20a and the (+) input terminal of the amplifier 20 and the capacitor 5 between the switch element S301 of the switching circuit 30 and the (+) input terminal of the amplifier 20 and further the capacitor 7 between the (−) input terminal of the amplifier 20 and the feedback circuit 20b and the capacitor 6 between the (−) input terminal of the amplifier 20 and the switch element S302 of the switching circuit 30, so that a differential voltage representable by charges reassigned to be stored in the capacitor pairs 5/8 and 6/7 is applied as the input voltage Di to the amplifier 20, thus differentially outputting the signal voltage Vo.

As a result of the above, SH actions of the capacitor pairs 5/8 and 6/7 and those of the capacitor pairs 9/12 and 10/11 are concurrently performed in a complementary manner, permitting the amplifier 20 to be always put in a holding state, achieving a two-fold speed increase in comparison with a conventional single SH unit, whose speed is comparable to a conventional SH circuit pair.

It will be easy for the artisan to analyse various potential relationships between the voltages Vi, Vo, Vrt and Vrb, as the capacitor circuitry CC2 comprises well-known elements.

For example, when the switches S301, S302 close as shown in FIG. 5, it follows that:

$$Vo = 2(Vin^+ - Vin^-) - (Vrt - Vrb)$$
$$= 2Vi - Vw.$$

Moreover, when the switches S301, S302 close to the short-circuit positions, Vo=2(Vin$^+$−Vin$^-$)=2Vi.

Further, when the switches S301, S302 close at their right positions in FIG. 5, it follows that:

$$Vo = 2(Vin^+ - Vin^-) + (Vrt - Vrb)$$
$$= 2Vi - Vw.$$

The switching circuit 30 may be modified to implement a desired conversion between the signals Vi and Vo.

The present invention may be embodied for sampling and holding an input signal appearing simply at a single input terminal.

FIG. 7 is a circuit diagram of an SH device according to another embodiment of the invention.

The SH device of FIG. 7 comprises: a signal node Vin for receiving a signal voltage; a reference node Vb having a reference voltage Vb; an operational amplifier having a (−) input terminal, a (+) input terminal connected to the reference bode Vb and an output terminal; a capacitor 13; another capacitor 14 equivalent in capacitance to the capacitor 13; and two pairs of switches responsive to control signal φ1 for connecting the capacitor 13 between the signal node Vin and the reference node Vb and the capacitor 14 between the (−) input terminal and the output terminal of the operational amplifier, and to an inverted signal φ2 of the control signal φ1 for connecting the capacitor 14 between the signal node Vin and the reference node Vb and the capacitor 13 between the (−) input terminal and the output terminal of the operational amplifier, while the control signals φ1 and φ2 are alternately effective.

The SH devices of FIGS. 7, 3 and 5 can be systematically described.

For example, the SH device of FIG. 7 comprises a first signal node (Vin) for receiving a first signal, a reference node (Vb) having a reference voltage, an operational amplifier having a first input terminal (−) and a first output terminal, a first capacitor (13), a second capacitor (14) equivalent in capacitance to the first capacitor (13), and switch means responsive to a first control signal (φ1) for connecting the first capacitor (13) between the first signal node (Vin) and the reference node (Vb) and the second capacitor (14) between the first input terminal (−) and the first output terminal of the operational amplifier, and to a second control signal (φ2) for connecting the second capacitor (14) between the first signal node (Vin) and the reference node (Vb) and the first capacitor (13) between the first input terminal (−) and the first output terminal of the operational amplifier, the first and second control signals (φ1, φ2) being alternately effective.

The SH device of FIG. 3 further (i.e., in addition to the elements of FIG. 7) comprises a second signal node (Vin$^+$) for receiving a second signal, the operational amplifier (20) having a second input terminal (+) with an opposite polarity to the first input terminal (−) and a second output terminal (−) with an opposite polarity to the first output terminal (+), a third (1) and a fourth capacitor (3) each equivalent in capacitance to the first capacitor (2), and the switch means (S11, S12, S21, S22, S31, S32, S41, S42) being responsive to the first control signal (φ1) for connecting the third capacitor (1) between the second signal node (Vin$^+$) and the reference node (Vb) and the fourth capacitor (3) between the second input terminal (+) and the second output terminal (−) of the operation amplifier (20), and to the second control signal (φ2) for connecting the fourth capacitor (3) between the second signal node (Vin$^+$) and the reference node (Vb) and the third capacitor (1) between the second input terminal (+) and the second output terminal (−) of the operational amplifier (20).

The SH device of FIG. 5 further (i.e., in addition to the elements of FIGS. 7 and 3) comprises a pair of weighting nodes (Vrt, Vrb) for receiving a weighting differential signal (Vw), a fifth (6), a sixth (5), a seventh (11) and an eighth capacitor (12) each equivalent in capacitance to the first capacitor, and the switch means (S5, S6, S7, S8, S9, S10, S11, S12, S12, S21, S32, S41, S301, S302) being responsive to the first control signal (φ1) for connecting the fifth capacitor (6) between the first signal node (Vin$^-$) and the reference node (Vb), the sixth capacitor (5) between the second signal node (Vin$^+$) and the reference node (Vb), the seventh capacitor (11) between the first input terminal (−) of the operational amplifier (20) and one (Vrb) of the weighting nodes (Vrt, Vrb), and the eighth capacitor (12) between the second input terminal (+) of the operational amplifier (20) and the other (Vrt) of the weighting nodes (Vrt, Vrb), and to the second control signal (φ2) for connecting the seventh capacitor (11) between the first signal node (Vin$^-$) and the reference node (Vb), the eighth capacitor (12) between the second signal node (Vin$^+$) and the reference node (Vb), the fifth capacitor (6) between the first input terminal (−) of the operational amplifier (20) and said one (Vrb) of the weighting nodes, and the sixth capacitor (5) between the second input terminal (+) of the operational amplifier (20) and said other (Vrt) of the weighting nodes.

In each embodiment of the invention, an output voltage contains an offset value as a DC component so that a signal voltage is obtainable as an AC component.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A sampling and holding device comprising:

a first signal node for receiving a first signal;

a reference node having a reference voltage;

an operational amplifier having a first input terminal and a first output terminal;

a first capacitor;

a second capacitor equivalent in capacitance to the first capacitor; and switch means responsive:

to a first control signal for connecting:
     the first capacitor between the first signal node and the reference node, and
     the second capacitor between the first input terminal and the first output terminal of the operational amplifier; and to a second control signal for connecting:
     the second capacitor between the first signal node and the reference node, and
     the first capacitor between the first input terminal and the first output terminal of the operational amplifier;

the first and second control signals being complementary with respect to each other so as to be alternately effective; and wherein said sampling and holding device further comprises:

a second signal node for receiving a second signal;

the operational amplifier having a second input terminal with an opposite polarity to the first input terminal and a second output terminal with an opposite polarity to the first output terminal;

a third and a fourth capacitor each equivalent in capacitance to the first capacitor; and the switch means also being responsive:

to the first control signal for connecting:
     the third capacitor between the second signal node and the reference node, and
     the fourth capacitor between the second input terminal and the second output terminal of the operational amplifier; and to the second control signal for connecting:
     the fourth capacitor between the second signal node and the reference node, and
     the third capacitor between the second input terminal and the second output terminal of the operational amplifier.

2. A sampling and holding device according to claim 1, further comprising:

a pair of weighting nodes for receiving a weighting differential signal;

fifth, sixth, seventh and eighth capacitors each equivalent in capacitance to the first capacitor; and the switch means also being responsive:

to the first control signal for connecting:
     the fifth capacitor between the first signal node and the reference node,
     the sixth capacitor between the second signal node and the reference node,
     the seventh capacitor between the first input terminal of the operational amplifier and one of the weighting nodes, and the eighth capacitor between the second input terminal of the operational amplifier and the other of the weighting nodes; and to the second control signal for connecting:
the seventh capacitor between the first signal node and the reference node,
the eighth capacitor between the second signal node and the reference node,
the fifth capacitor between the first input terminal of the operational amplifier and said one of the weighting nodes, and
the sixth capacitor between the second input terminal of the operational amplifier and said other of the weighting nodes.

3. A sampling and holding device comprising:

a pair of capacitor means concurrently operable for alternatively sampling to hold a first voltage by storing therein a first quantity of charges and alternatively supplying a second voltage defined by a second quantity of charges stored therein;

an operational amplifier for amplifying the second voltage to output a third voltage representative of the first voltage; said operational amplifier comprising:
first and second input terminals for differentially inputting the first voltage; and
first and second output terminals for differentially outputting the third voltage, switch means responsive to a first control signal for connecting:
a first capacitor means between a first signal node and a reference node, and
a second capacitor means between the first input terminal and the first output terminal, and the first output terminal, a second control signal for connecting:
the second capacitor between the first signal node and the reference node, and
the first capacitor between the first input terminal and the first output terminal;
the first and second control signals being complementary with respect to each other so as to be alternatively effective.

4. A sampling and holding device according to claim 3, wherein the first quantity of charges is equivalent to the second quantity of charges.

5. A sampling and holding device according to claim 3, wherein the second voltage is corrected from the first voltage, by controlling the second quantity of charges.

* * * * *

UNITED STATES PATENT AND TRADEMARK OFFICE
CERTIFICATE OF CORRECTION

PATENT NO. : 5,698,999
DATED : December 16, 1997
INVENTOR(S) : ETOH ET AL

It is certified that error appears in the above-indentified patent and that said Letters Patent is hereby corrected as shown below:

Claim 3, Col. 12, line 8, after " , " delete --and the first output terminal,--

Signed and Sealed this

Second Day of June, 1998

Attest:

BRUCE LEHMAN

Attesting Officer

Commissioner of Patents and Trademarks